United States Patent
Warwick

(10) Patent No.: US 6,515,332 B1
(45) Date of Patent: Feb. 4, 2003

(54) INSULATED-GATE FIELD-EFFECT SEMICONDUCTOR DEVICE

(75) Inventor: Andrew M. Warwick, Stockport (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/505,987

(22) Filed: Feb. 16, 2000

(30) Foreign Application Priority Data

Feb. 17, 1999 (GB) ............................................. 9903607

(51) Int. Cl.[7] .......................... H01L 27/01; H01L 29/00
(52) U.S. Cl. ................... 257/347; 257/349; 257/508
(58) Field of Search ................................. 257/508, 347, 257/367, 621, 774, 507

(56) References Cited

U.S. PATENT DOCUMENTS

| | | | | |
|---|---|---|---|---|
| 4,408,384 A | * | 10/1983 | Lowis et al. | 29/571 |
| 4,763,183 A | | 8/1988 | Ng et al. | 357/23 |
| 5,382,818 A | | 1/1995 | Pein | 257/347 |
| 5,808,346 A | | 9/1998 | Ueda | 257/774 |
| 6,072,215 A | * | 6/2000 | Kawaji | 257/334 |
| 6,133,610 A | * | 10/2000 | Bolam | 257/349 |
| 6,172,402 B1 | * | 1/2001 | Gardner | 257/347 |
| 6,191,455 B1 | * | 2/2001 | Shida | 257/362 |

* cited by examiner

Primary Examiner—Carl Whitehead, Jr.
Assistant Examiner—Kiesha Rose
(74) Attorney, Agent, or Firm—Steven R. Biren

(57) ABSTRACT

An insulated-gate field-effect semiconductor device, preferably of the SOI type, has source (3) and drain (4) regions in a semiconductor body portion (1) at a first major surface of a semiconductor substrate (10). The gate-terminal metallisation (25) is present at an opposite second major surface (12) of the substrate (10). A gate connection (15,55) is present between the gate electrode (5) and the substrate (10) to connect the gate electrode (5) to the gate-terminal metallisation (25). This arrangement permits better use of the layout area for source-terminal and drain-terminal metallisations, and their connections, at the upper major surface (11) of the body portion (1), without introducing an on-resistance penalty. The part of the gate connection provided by the substrate (10) does not increase the on-resistance of the main current path through the device, i.e. between the source (3) and drain (4). Furthermore, a p-n junction diode can be readily integrated between the channel region (2) and the gate connection (15,55).

12 Claims, 4 Drawing Sheets

INSULATED-GATE FIELD-EFFECT SEMICONDUCTOR DEVICE

BACKGROUND OF THE INVENTION

This invention relates to insulated-gate field-effect semiconductor devices, particularly but not exclusively of the so-called "SOI" (semiconductor on insulator) type, and further relates to methods of manufacturing such semiconductor devices.

Insulated-gate field-effect semiconductor devices are known, having source and drain regions in a semiconductor body portion at a first major surface of a semiconductor substrate, and a gate electrode on a gate-dielectric layer between the source and drain regions for controlling a conduction channel in a channel region between the source and drain regions in an on-state of the device. A gate-terminal metallisation is connected to the gate electrode for applying a potential to the gate electrode. Source-terminal and drain-terminal metallisations are connected respectively to the source and drain regions.

United States patent specification U.S. Pat. No. 4,408,384 (our ref: PHB32654) discloses such a known device in which the gate-terminal and drain-terminal metallisations are present at the upper major surface of the body portion, whereas the source-terminal metallisation is present at an opposite major surface of the semiconductor substrate. A source connection is present between the source region and the semiconductor substrate to connect the source region to the source-terminal metallisation via the semiconductor substrate. U.S. Pat. No. 4,408,384 discloses a method of manufacturing this device in which the source connection is carried by a trench in the form of a V-shaped groove etched across the thickness of the semiconductor body portion to the substrate. The whole contents of U.S. Pat. No. 4,408,384 are hereby incorporated herein as reference material.

The provision of the source-terminal metallisation at the opposite major surface of the semiconductor substrate is advantageous in making better use of the layout area for the gate-terminal and drain-terminal metallisations and their connections at the upper major surface of the body portion. By mounting the substrate on a conductive lead-frame (or other conductor of the device package), a simple connection can be made to the source-terminal metallisation at the opposite major surface of the semiconductor substrate. However this arrangement of the source-terminal metallisation increases the on-resistance of the device, by adding the resistance due to the thickness of the substrate. If the substrate is thinned so as to reduce the electrical resistance therethrough to the source-terminal metallisation, then handling the device becomes less easy.

SUMMARY OF THE INVENTION

According to the present invention there is provided an insulated-gate field-effect semiconductor device, in which source and drain regions are present at a semiconductor body portion at a first major surface of a semiconductor substrate, and the gate-terminal metallisation is present at an opposite second major surface of the semiconductor substrate. A gate connection is present between the gate electrode and the semiconductor substrate to connect the gate electrode to the gate-terminal metallisation via the semiconductor substrate.

The gate-terminal metallisation serves for applying a potential to the gate electrode. Thus, in a device in accordance with the present invention, the part of the gate connection provided by the substrate does not increase the on-resistance of the main current path through the device, i.e. between the source and drain. Thus, the arrangement of the gate-terminal metallisation at the opposite major surface of the semiconductor substrate is advantageous in permitting better use of the layout area for source-terminal and drain-terminal metallisations (and their connections) at the upper major surface of the body portion, without introducing an on-resistance penalty. By mounting the substrate on a conductive lead-frame (or other conductor of the device package), a simple connection can be made to the gate-terminal metallisation at this opposite major surface of the semiconductor substrate.

The present invention can be particularly advantageous for a SOI device configuration, in which the semiconductor body portion is present on an insulating layer at the first major surface of the semiconductor substrate. The insulating layer may be sufficiently thin and of suitable dielectric that the gate-connected substrate itself acts as a second insulated gate adjacent to the body portion. This gate effect of the substrate can enhance the effect of the actual gate electrode in controlling turn-on of the device. In a particularly advantageous form, the gate connection can be carried by a trench in the body portion. The trench can extend through the insulating layer in order to carry the gate connection to the substrate.

The gate connection between the gate electrode and the substrate may be formed by extending the gate electrode itself and/or by providing an additional layer or region. Thus, this connection may comprise a metal layer and/or a semiconductor region. The region may be, for example a doped semiconductor region of the body portion and/or of the substrate. The metal layer may contact a semiconductor area of the substrate and/or of the body portion. It may extend on, for example, an insulating layer. The insulating layer may be present on the semiconductor body portion (for example on its upper surface and/or on a side wall) and/or on the gate electrode. The gate connection may be buried under the gate electrode (for example in a trench in the semiconductor body portion). The gate electrode may extend on a gate-dielectric layer on the upper surface of the body portion. In another form, the gate electrode may be a trench-gate in the semiconductor body portion. In this latter case, the gate connection may be a buried connection that is carried by a second trench, from the trench-gate across a remaining thickness of the semiconductor body portion to the substrate.

A particularly advantageous aspect of the present invention is in facilitating the integration of a p-n junction protection diode in parallel with the insulated gate of the device. The diode may be formed from pre-existing regions of the device (by changing the layout) and/or by providing additional regions or additional dopings. Thus, in a device in accordance with the invention, the semiconductor body portion may also comprise a p-n junction diode between the channel region of a first conductivity type and a diode region of the opposite second conductivity type. The diode region of the second conductivity type may be a region of increased doping concentration in the substrate and/or body portion. This diode region may form part of the gate connection in the body portion or substrate, and/or it may be contacted by the gate connection, for example at the side wall of a trench carrying the gate connection in the body portion. Thus, the diode region of the second conductivity type can be readily connected to the gate electrode by the gate connection. Indeed, the diode may be provided by a mask layout redesign, without requiring any additional process steps. A series of the diodes may even be formed.

BRIEF DESCRIPTION OF THE DRAWING

These and other aspects of the present invention are illustrated in embodiments now described, by way of example, with reference to the accompanying diagrammatic drawings, in which.

DESCRIPTION OF THE PREFERRED EMBODIMENTS

Figure 1:
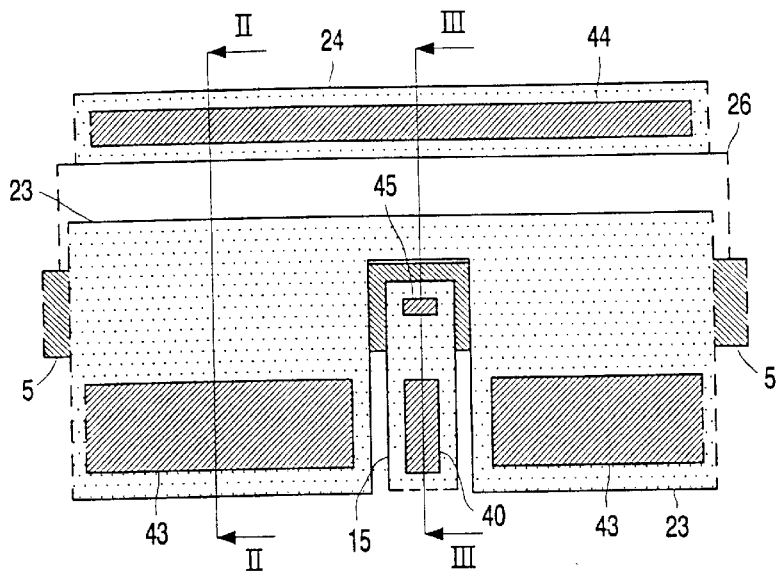
FIG. 1 is a plan view of part of a SOI embodiment of an insulated-gate field-effect semiconductor device in accordance with the invention.
Figure 2:
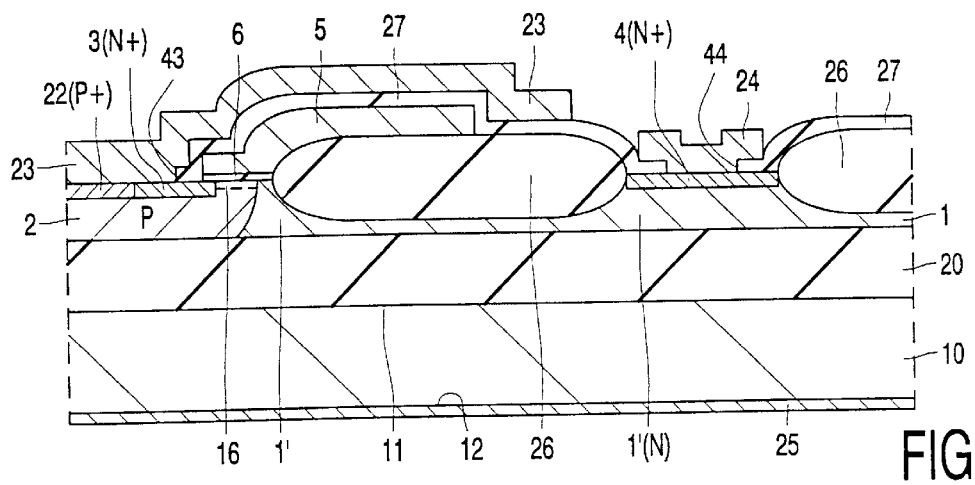
FIG. 2 is a cross-sectional view on the line II—II of FIG. 1, showing source and drain electrode connections.
Figure 3:
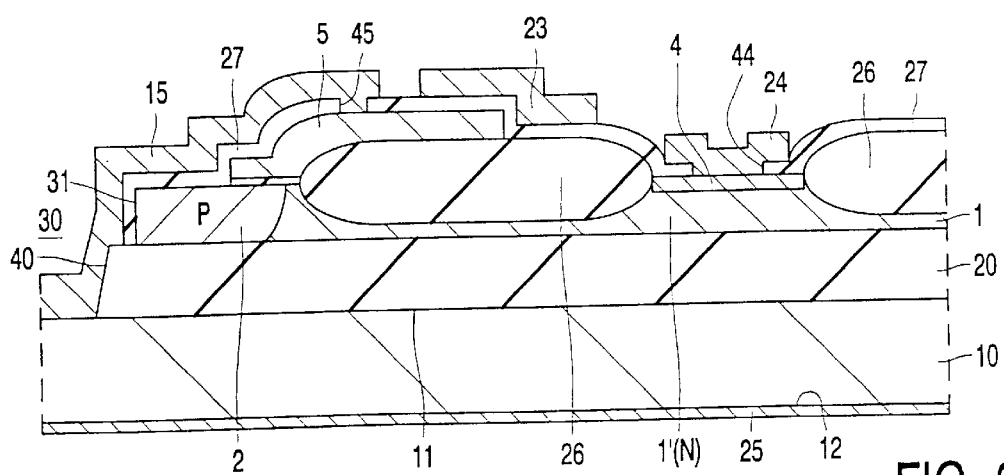
FIG. 3 is a cross-sectional view on the line III—III of FIG. 1, showing the gate electrode connection.
Figure 4:
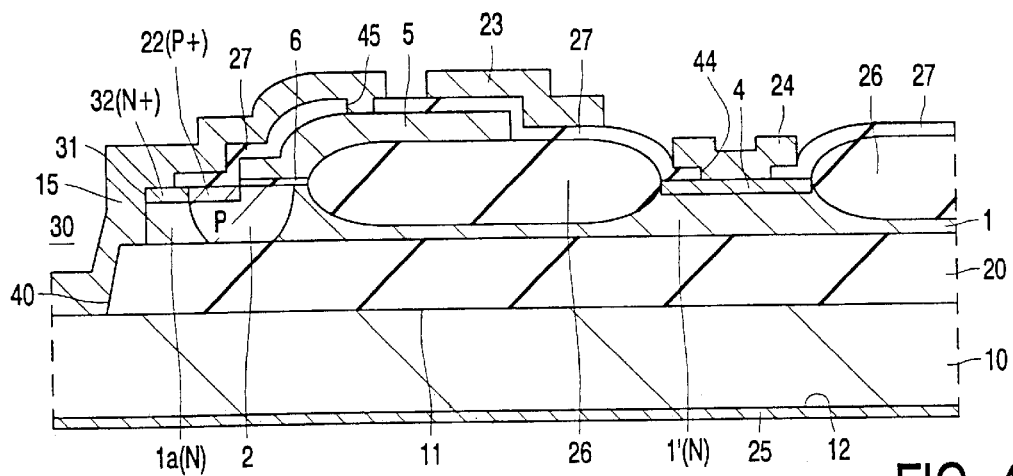
FIG. 4 is a similar cross-sectional view to that of FIG. 3, showing the gate electrode connection contacting a p-n junction diode.
Figure 5:
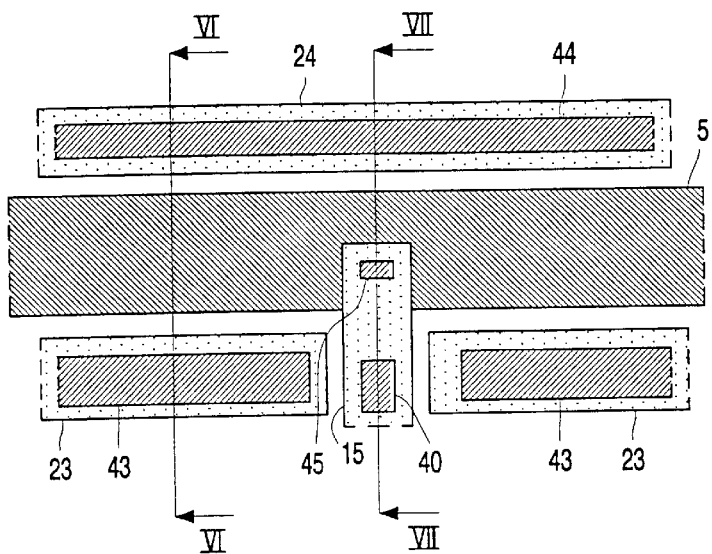
FIG. 5 is a plan view of part of a monolithic (non-SOI) embodiment of an insulated-gate field-effect semiconductor device in accordance with the invention.
Figure 6:
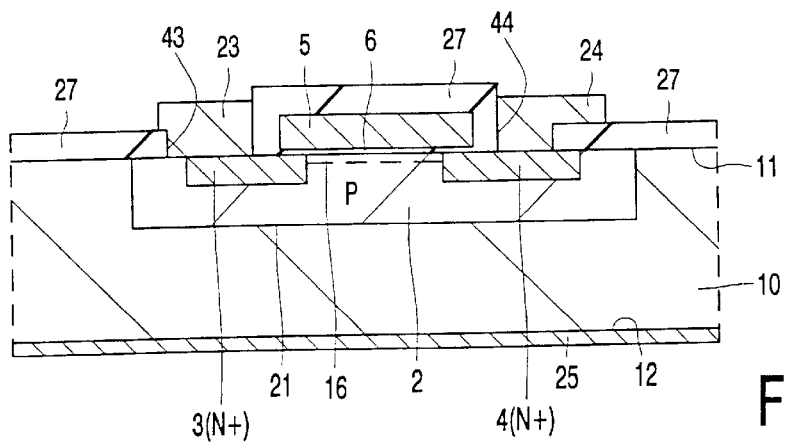
FIG. 6 is a cross-sectional view on the line VI—VI of FIG. 5, showing source and drain electrode connections.

It should be noted that all the FIGS. 1 to 11 are diagrammatic. Relative dimensions and proportions of parts of these Figures have been shown exaggerated or reduced in size, for the sake of clarity and convenience in the drawings. In the plan-view drawings of FIGS. 1 and 5, the different parts of the device that extend to the drawing perimeter of FIGS. 1 and 5 are terminated at different locations adjacent the drawing perimeter for the sake of clarity in identifying these device parts. Furthermore, as FIGS. 1 and 5 show only the innovative part of each device layout, it should be noted that these device parts extend beyond the drawing perimeter and their actual peripheral termination is not illustrated, the layout part shown in FIGS. 1 and 5 being the basis of a repetitive layout that is suitable for various device geometries, for example interdigitated or cellular. The same reference signs are generally used to refer to corresponding or similar features in modified and different embodiments.

The insulated-gate field-effect semiconductor devices in all the embodiments of FIGS. 1 to 11 have a semiconductor body portion 1 at a first major surface 11 of a semiconductor substrate 10. Source and drain regions 3 and 4 are present in the body portion 1. The insulated gate of each device comprises a gate electrode 5 on a gate-dielectric layer 6 between the source and drain regions 3 and 4. The gate electrode 5 is capacitively coupled via the gate-dielectric layer 6 to a channel region 2 that separates the source and drain regions 3 and 4. By field-effect action in known manner, the gate electrode 5 serves for controlling a conduction channel 16 in the channel region 2, so as to control current flow between the source and drain regions 3 and 4 in an on-state of the device. Thus, in an enhancement-channel device, a voltage signal applied to the gate electrode 5 in the on-state of the device induces the conduction channel 16 and controls current flow in this conduction channel 16.

At respective windows 43 and 44 in an insulating layer structure 26, 27 on the body portion 1, the source and drain regions 3 and 4 are contacted by respective electrodes 23 and 24. These electrodes 23 and 24 connect the source and drain regions 3 and 4 to respective source-terminal and drain-terminal metallisations on the insulating layer structure 26, 27. A gate-terminal metallisation 25 is connected to the gate electrode 5 for applying the gate voltage signal to the gate electrode 5. In accordance with the present invention, the gate-terminal metallisation 25 in all the devices of FIGS. 1 to 11 is present at an opposite second major surface 12 of the semiconductor substrate 10 and typically covers the surface 12. A gate connection 15 is present between the gate electrode 5 and the semiconductor substrate 10, so as to connect the gate electrode 5 to the gate-terminal metallisation 25 via the semiconductor substrate 10.

Typically, the semiconductor substrate 10 and body portion 1 comprises monocrystalline silicon. The insulating layer structure 26, 27 may comprise silicon dioxide, and the gate electrode 5 may comprise doped polycrystalline silicon. Typically, the source and drain electrodes 23 and 24 and their terminal metallisations may comprise an alloy of aluminium, to which connection wires may be bonded in the packaged device. The gate-terminal metallisation may comprise a different alloy, for example of titanium-nickel-silver to permit soldering of the substrate 10 to a lead-frame in the packaged device. The source and drain regions 3 and 4 may be n-type conductivity (doped with, for example, arsenic or phosporus) in an enhancement n-channel device, in which case the channel region 2 is of opposite conductivity type (doped with, for example, boron). In order to suppress a parasitic bipolar transistor between regions 3, 2, 4, the source electrode 23 typically contacts both the source region 3 and a part 22 of the channel region 2 remote from the channel 16. Typically, this contacted part 22 may have an increased doping concentration (p+) as compared with the area where the channel 16 is induced.

FIGS. 1 to 4 illustrate exemplary SOI embodiments of the present invention. In this case, the body portion 1 is present on an insulating layer 20 (typically of silicon dioxide) at the major surface 11 of the semiconductor substrate 10. The substrate 10 may be either n-type or p-type. In these devices the original (n-type) doping of the body portion 1 provides a drain drift region 1' that separates the p-type doped channel region 2 from the highly doped (n+) drain region 4. A thick LOCOS (locally oxidised silicon) part 26 of the insulating layer structure is present in the drift region 1' between the channel region 2 and the drain region 4. The drift region 1' is isolated from the substrate 10 by the insulating layer 20.

SOI device technology is well-known in the art, for example as described in United States patent specification U.S. Pat. No. 5,382,818 (our ref: PHA21855), the whole contents of which are hereby incorporated herein as reference material. In known SOI devices the substrate (10) is typically at ground potential, and so is the source region (3).

In the SOI device of U.S. Pat. No. 5,382,818, a buried p-n junction diode is formed at the surface (11) of the substrate where it is connected to the drain region (4) of the device. These reference numbers in brackets relate the similar device parts in the present invention to the known SOI device parts.

By contrast with known SOI devices, the SOI devices of FIGS. 1 to 4 have their gate electrode 5 connected to the substrate 10 at a window 40 in the insulating layer 20. The insulating layer 20 may be sufficiently thin (for example, a few µm in thickness) and of suitable dielectric (for example, silicon dioxide) that the gate-connected substrate 10 itself acts as a second insulated gate adjacent to the body portion 1. This gate effect of the substrate 10 can enhance the effect of the actual gate electrode 5 in controlling turn-on of the device.

In the particular embodiment specifically illustrated in FIG. 3, the gate connection 15 comprises a metal layer of, for example, aluminium that contacts the gate electrode 5 at a window 45 in an insulating layer 27. This metal layer 15 extends over the insulating layer structure 26,27 to the substrate 10. A trench 30 extends across the thickness of the body portion 1 and through the underlying insulating layer 20 to carry this gate connection 15 to the substrate 10. Thus, as illustrated in FIG. 3, the metal layer 15 is present on the insulating layer 27 on a side-wall 31 of the trench 30, and it contacts the substrate 10 at the bottom of the trench 30 via the window 40 in the insulating layer structure 20,26,27. In the FIG. 3 embodiment, the insulating layer 27 insulates the gate connection 15 from the body portion 1 at the side wall 31. In the example illustrated, it is part of the channel region 2 of the body portion 1 that adjoins the side wall 31.

Such a gate-substrate connection scheme in one or more trenches 30 can be implemented in a relatively small layout area within the total device layout area. For a large area device a number of such gate-substrate trench connections can be distributed in and around the total device layout area to ensure simultaneous operation of the gate electrode 5 throughout the whole device, for ensuring uniform turn on and turn off of the device.

FIG. 4 illustrates a modified arrangement at a side wall 31, in order to provide a protective p-n junction diode 22,32 in parallel with the insulated gate structure 5,6,2 of the device. In this modification, the semiconductor body portion 1 comprises the p-n junction diode 22,32 between the p-type channel region 2 and a diode region 32 of the opposite conductivity type (n-type in this example of an n-channel enhancement device).

The diode 22,32 of FIG. 4 is actually present at an isolated area 1a of the body portion 1, being isolated by the channel region 2 extending across the thickness of the body portion 1. The diode region 32 adjoins the side-wall 31 of the trench 30 and is connected to the gate electrode 5 by the gate connection 15 at the side-wall 31. Preferably, the diode region 32 comprises an increased doping concentration (n+) in the body portion 1. Preferably, the channel region 2 has an increased doping concentration (p+) in its region 22 adjacent to the diode region 32 so as to reduce the breakdown voltage of the p-n junction diode 22,32. Typically a breakdown voltage of 7 volts to 20 volts may be provided for the p-n junction diode 22,32. This diode serves as a Zener clamp to protect the gate dielectric 6 from electrostatic damage.

In the FIG. 4 illustration, these diode regions 32 and 22 are shallow regions, and they can be formed in the same doping steps as the source region 3 and the p+contact of the channel region 2. Thus, such a diode modification of the gate-substrate connection in accordance with the invention permits such a protection diode 22,32 to be incorporated in a very compact layout in the device, and without requiring any additional mask steps or process steps.

As already described, a large-area device may have a number of the gate-substrate trench connections distributed in and around the total device layout area. Some of these connections may include a protective p-n junction diode 22,32 as in FIG. 4, while others may be a more simple connection as in FIG. 3.

Although the present invention is particularly advantageous for SOI devices, it may be used in non-SOI devices. Thus, for example, FIGS. 5 to 8 illustrate the use of gate-substrate connections in monolithic device embodiments, in which the semiconductor body portion 1 forms a p-n junction 21 with the semiconductor substrate 10. This p-n junction 21 isolates the body portion 1 from the semiconductor substrate 10. In some forms of monolithic device, a trench 30 may still be used to carry the gate connection 15 to the substrate 10, for example when the body portion 1 is an epitaxial layer of one conductivity type on a substrate 10 of the opposite conductivity type.

FIGS. 5 to 8 illustrate embodiments in which the semiconductor body portion 1 is a locally over-doped portion of the semiconductor substrate 10. In the examples illustrated, this p-type over-doped portion 1 was formed adjacent to only a part of the major surface 11 of the substrate 10, and so the p-n junction 21 terminates in the surface 11. Thus, the substrate surface 11 provides the device with an upper surface which is locally adjoined by the p-type body portion 1 and also by a surrounding part of the (non over-doped) bulk of the substrate 10 with its original n-type doping. This device configuration does not need a trench 30 for the gate connection to the substrate surface 11.

The gate connection comprises a metal layer 15 that contacts the gate electrode 5 at a window 45 in an insulating layer structure 27. This metal layer 15 extends over the insulating layer structure 27 to contact the substrate 10 at a window 40. In order to form a good ohmic contact between the metal layer 15 and the n-type substrate 10, the gate connection also comprises a highly doped (n+) semiconductor region 14 at the surface 11. In the arrangement shown in FIG. 7, the connection region 14 is spaced from the body portion 1 which is of the opposite conductivity type (p-type). In the devices of FIGS. 5 to 8, it is this opposite-type body portion 1 that provides the p-type channel region 2 of the enhancement n-channel device.

Figure 7:
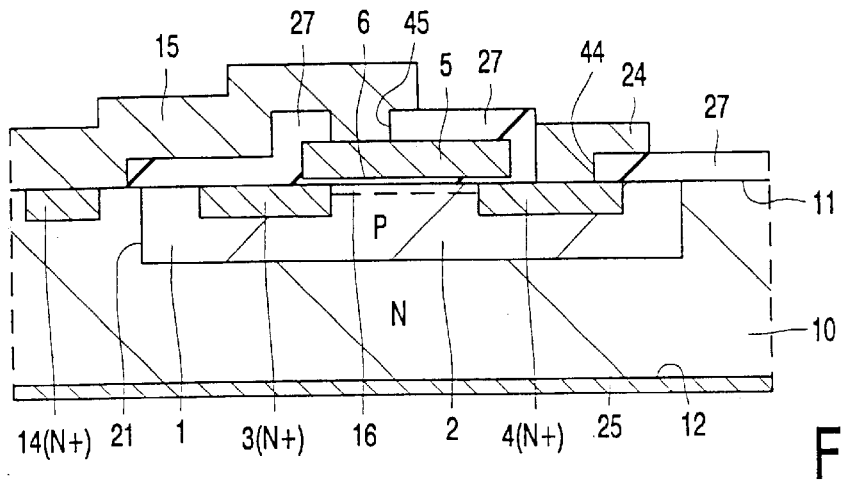
FIG. 7 is a cross-sectional view on the line VII—VII of FIG. 5, showing the gate electrode connection.
Figure 8:
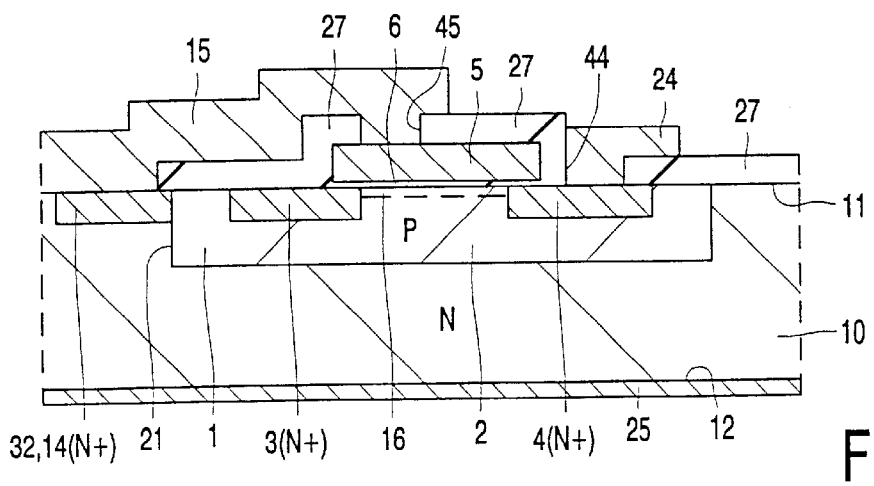
FIG. 8 is a similar cross-sectional view to that of FIG. 7, showing the gate electrode connection contacting a p-n junction diode.

FIG. 8 illustrates a modification of the FIG. 7 connection, in order to include a p-n junction diode in parallel with the insulated gate structure 5,6,2 of the device. In this modification, the p-n junction diode is a local modification of the p-n junction 21 and is formed between the p-type channel region 2 and a highly doped diode region 32 of the opposite conductivity type (n-type). The diode region 32 is a part of the substrate 10 that is of increased doping concentration (n+) adjacent to the surface 11 of the substrate 10 and that is contacted by the gate connection layer 15. In the FIG. 8 embodiment, the highly doped contact region 14 is extended laterally to the surface-termination of the p-n junction 12 in order to form this diode region 32. The diode may be of the punch-through type which turns on when, with sufficient reverse bias, a depletion layer punches through the region 2 between the diode region 32,14 and the source region 3. Alternatively, the doping of the channel region 2 in the area 22 adjacent the diode region 32,14 may be increased (p+) to form a Zener diode junction with the diode region 32,14.

The FIG. 8 modification of the gate-substrate connection in accordance with the invention permits the protection diode to be incorporated in a very compact layout in the device, and without requiring any additional mask steps or process steps. As already described, a large area device may have a number of the gate-substrate connections distributed in and around the total device layout area. Some of these connections may include a protective p-n junction diode as in FIG. 8, while others may be a simple connection as in FIG. 7.

Figure 9:
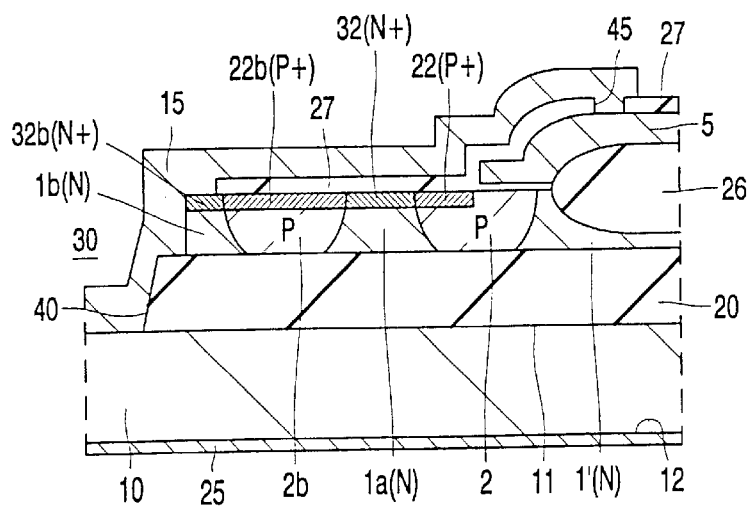
FIG. 9 is a cross-sectional view corresponding to the gate-connection area of FIG. 4, showing a modification having series diodes in a SOI embodiment in accordance with the invention.

It will be evident that other modifications and variations are possible in accordance with the invention. Thus, for example, a chain of protective diodes may be formed between the channel region 2 and the gate connection 15 so as to achieve a higher breakdown voltage than that of one diode. FIG. 9 illustrates an SOI embodiment having such diodes in series, with two isolated areas 1a and 1b of the body portion 1. These diodes are formed by an n-p-n-p sequence of regions 32b (in 1b), 22b (in 2b), 32 (in 1a) and 22 (in 2).

Figure 10:
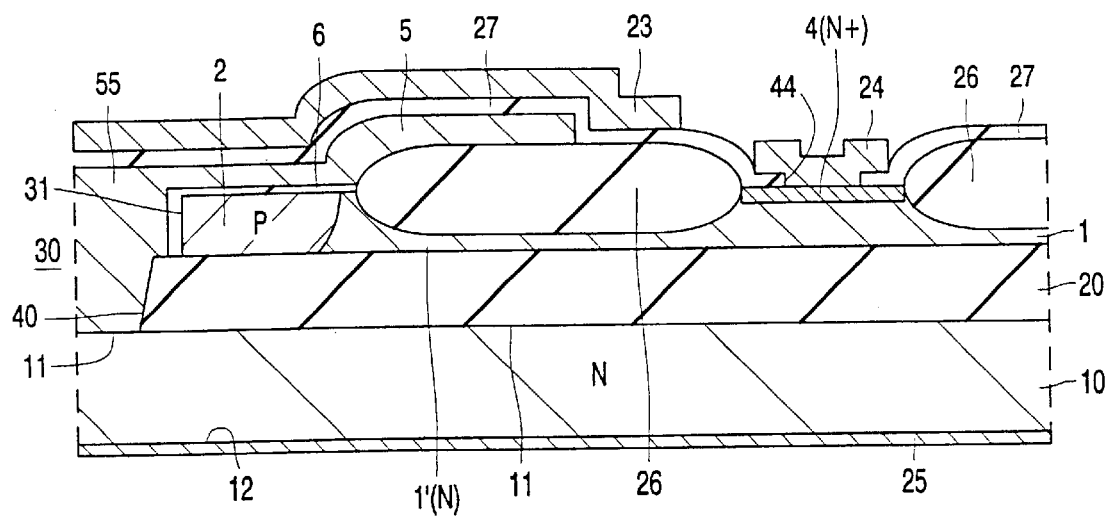
FIG. 10 is a cross-sectional view corresponding to the gate-connection area of FIG. 3, showing a modification having a buried gate-connection in a SOI embodiment in accordance with the invention.

In the embodiments of FIGS. 1 to 9, the gate connections 15 extend up and over the gate electrodes 5 and contact the gate electrodes 5 at windows 45 in an insulating layer 27 on the gate electrode. However, in an alternative form, the gate connection may be buried under the gate electrode 5 (for example in a trench in the semiconductor body portion 1). FIG. 10 illustrates a modification of FIG. 3 to provide a buried gate connection 55 as an extension of the gate electrode 5. In the example as illustrated, the insulating layer 6 extends also on the side-wall 31 of the trench 30, and the trench 30 is filled with the conductive material (for example, doped polycrystalline silicon) that also provides the gate electrode 5.

Figures 11A, 11B:
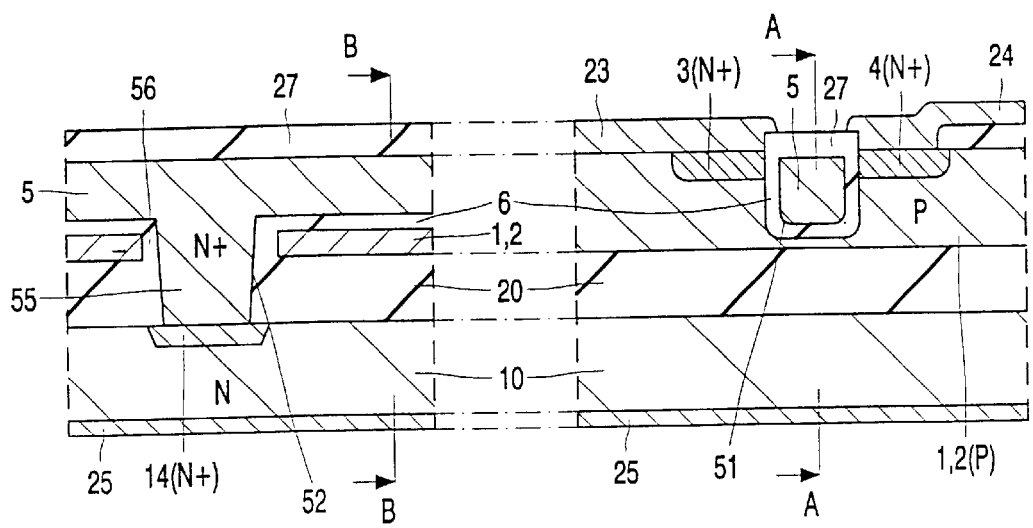
FIGS. 11A and 11B are cross-sectional views of part of a trench-gate embodiment of a device in accordance with the invention, FIG. 9A being taken on the line A—A to show the gate electrode connection, and FIG. 9B being taken on the line B—B to show the source and drain electrode connections.

In the embodiments of FIGS. 1 to 10, the connection trenches 30 and the gate connections 15, 55 extend across the whole thickness of the body portion 1. However, it is also possible to have a buried gate connection 55 that extends across only a part of the thickness of the body portion 1. The embodiment of FIGS. 11A and 11B is a trench-gate device, in which the gate electrode 5 is present as a trench-gate in a first trench 51 in the semiconductor body portion 1. The gate connection 55 is buried in a second trench 52 that extends from the first trench 51 across a remaining thickness of the semiconductor body portion 1 to the substrate 10. The gate connection 55 may be formed of the same material (doped polycrystalline silicon) as the gate electrode 5. An insulating layer 56 may be present on the side walls of the lower trench 52 to isolate the gate connection 55 from the body portion 1 that provides the channel region 2 of the device. The gate-dielectric layer 6 is present on the side walls of the upper trench 51 and on its bottom, except where the connection 55 is provided. Thus, in this case, there is no need for a gate-contact window in the insulating layer 27 on the gate electrode 5. The buried gate connection 55 may contact a highly doped (n+) semiconductor region 14 at the surface 11 of the substrate 10.

FIG. 11A shows the body portion 1 at opposite facing side-walls of the connection trench 52. It will be evident that the connection trenches 30 within the active device areas of FIGS. 1 to 10 also generally have opposite facing side-walls 31 (extending through the body portion 1) when the layout part shown in FIGS. 1 and 5 is repeated as the basis of the total device layout, for example interdigitated or cellular. However a connection trench 30 may be present at the actual peripheral termination of the active device and so a side-wall 31 (with gate connection 15, 55) may even form a part of the perimeter of the active device.

All the embodiments illustrated in FIGS. 1 to 11 have a highly doped drain region 4 of the same conductivity type (n-type in these examples) as the source region 14, so as to provide a MOSFET device. Alternatively, the region 4 may be of opposite conductivity type (p-type in these examples) to provide an IGBT device. Although enhancement n-channel embodiments have been illustrated in FIGS. 1 to 11, the present invention may also be used for gate-substrate connections (and protective diode inclusion) in enhancement p-channel devices, for example by reversing conductivity types for the various semiconductor regions, body portions and substrates. Furthermore, the invention may be used with depletion-channel insulated-gate field-effect devices.

From reading the present disclosure, other variations and modifications will be apparent to persons skilled in the art. Such variations and modifications may involve equivalent and other features which are already known in the design, manufacture and use of semiconductor devices and component parts thereof, and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention.

The applicants hereby give notice that new claims may be formulated to any such features and/or combinations of such features during the prosecution of the present application or of any further application derived therefrom.

What is claimed is:

1. An insulated-gate field-effect semiconductor device having source and drain regions in a semiconductor body portion at a first major surface of a semiconductor substrate, a gate electrode on a gate-dielectric layer between the source and drain regions for controlling a conduction channel in a channel region between the source and drain regions in an on-state of the device, and a gate-terminal metallisation connected to the gate electrode for applying a potential to the gate electrode, characterised in that the gate-terminal metallisation is provided directly on an opposite second major surface of the semiconductor substrate, and a gate connection is present between the gate electrode and the semiconductor substrate to connect the gate electrode to the gate-terminal metallisation via the semiconductor substrate.

2. A semiconductor device as claimed in claim 1, further characterised in that the gate connection is carried by a trench that extends across the thickness of the semiconductor body portion to the substrate.

3. A semiconductor device as claimed in claim 2, further characterised in that the semiconductor body portion is present on an insulating layer at the first major surface of the semiconductor substrate, and a window at the bottom of the trench extends through the insulating layer to carry the gate connection to the substrate.

4. A semiconductor device as claimed in claim 3, further characterised in that the semiconductor body portion also comprises a p-n junction diode between the channel region of a first conductivity type and a diode region of the opposite second conductivity type, which diode region adjoins a side-wall of the trench and is connected to the gate electrode by the gate connection at the side-wall.

5. A semiconductor device as claimed in claim 4, further characterised in that the channel region of a first conductivity type has an increased doping concentration adjacent to the diode region of the opposite second conductivity type.

6. A semiconductor device as claimed in claim 1, further characterised in that the semiconductor body portion also comprises a p-n junction diode between the channel region of a first conductivity type and a diode region of the opposite second conductivity type, which diode region is connected to the gate electrode by the gate connection.

7. A semiconductor device as claimed in claim 6, further characterised in that the semiconductor body portion is an over-doped portion of the semiconductor substrate, and the diode region of the second conductivity type is a substrate region of increased doping concentration adjacent to the first major surface of the substrate.

8. A semiconductor device as claimed in claim 1, further characterised in that the gate connection is buried in a trench that extends from underneath the gate electrode to the substrate.

9. A semiconductor device as claimed in claim 1, further characterised in that the gate connection comprises an extension of the gate electrode.

10. A semiconductor device as claimed in claim 1, further characterised in that the gate connection comprises a metal layer that contacts the gate electrode and extends over an insulating layer structure to the substrate.

11. A semiconductor device as claimed in claim 10, further characterised in that the metal layer is present on the insulating layer structure on a side-wall of a trench that extends across the semiconductor body portion to the substrate, and the metal layer contacts the substrate at the bottom of the trench via a window in the insulating layer structure.

12. A semiconductor device as claimed in claim 1, further characterised in that the channel region is of a first conductivity type, and the gate connection comprises a semiconductor region of the second conductivity type.

* * * * *